(12) United States Patent
Chen et al.

(10) Patent No.: US 6,590,450 B2
(45) Date of Patent: Jul. 8, 2003

(54) SYSTEM AND METHOD FOR LINEARIZING VACUUM ELECTRONIC AMPLIFICATION

(75) Inventors: Tong Chen, Mountain View, CA (US); Yehuda G. Goren, Palo Alto, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 0 days.

(21) Appl. No.: 09/943,861

(22) Filed: Aug. 31, 2001

(65) Prior Publication Data

US 2002/0041211 A1 Apr. 11, 2002

Related U.S. Application Data

(63) Continuation of application No. 09/481,854, filed on Jan. 14, 2000, now Pat. No. 6,285,254.

(51) Int. Cl.$^7$ ................................................. H03F 1/26
(52) U.S. Cl. ........................... 330/149; 330/3; 330/129; 330/43
(58) Field of Search ............................... 330/149, 129, 330/136, 3, 43, 44

(56) References Cited

U.S. PATENT DOCUMENTS

| | | | | |
|---|---|---|---|---|
| 3,564,124 A | * | 2/1971 | Popovich ..................... | 178/5.4 |
| 3,612,880 A | * | 10/1971 | Lansiart ..................... | 250/83.6 |
| 3,696,324 A | * | 10/1972 | Baum ......................... | 340/1 R |
| 3,716,745 A | * | 2/1973 | Phillips ....................... | 315/3.6 |
| 3,900,823 A | * | 8/1975 | Sokal et al. ................. | 330/149 |
| 4,233,539 A | * | 11/1980 | Falce ......................... | 315/5.38 |
| 4,495,640 A | * | 1/1985 | Frey ............................ | 381/61 |
| 5,796,211 A | * | 8/1998 | Graebner et al. ............. | 315/3.5 |

* cited by examiner

Primary Examiner—Robert Pascal
Assistant Examiner—Henry Choe
(74) Attorney, Agent, or Firm—Kirkpatrick & Lockhart LLP

(57) ABSTRACT

An amplifier system including a vacuum tube amplifier having an input signal terminal, an output signal terminal, and an electron source, and a control circuit having an input terminal coupled to one of the input signal terminal and the output signal terminal, and for controlling a kinetic energy of electrons emitted by the electron source based on one of an input signal to the vacuum tube amplifier and an output signal from the vacuum tube amplifier. According to another embodiment, the control circuit may be for controlling an amount of electrons emitted by the electron source based on one of the input signal to the vacuum tube amplifier and the output signal from the vacuum tube amplifier. According to another embodiment, the control circuit may be for both controlling the kinetic energy of electrons emitted by the electron source based on one of the input signal and the output signal, and controlling the amount of electrons emitted by the electron source based on one of the input signal and the output signal.

25 Claims, 9 Drawing Sheets

SYSTEM AND METHOD FOR LINEARIZING VACUUM ELECTRONIC AMPLIFICATION

CROSS-REFERENCE TO RELATED APPLICATIONS

This application is a continuation of U.S. patent application Ser. No. 09/481,854, filed Jan. 14, 2000, now U.S. Pat. No. 6,285,254.

STATEMENT REGARDING FEDERALLY SPONSORED RESEARCH AND DEVELOPMENT

Not Applicable.

BACKGROUND OF INVENTION

1. Field of Invention

The present invention relates generally to vacuum electronics and, more particularly, to the circuits and method for linearizing vacuum electronic amplification.

2. Description of the Background

Amplifiers come in many forms and are used in many applications. For example, amplifiers may be used with digital or analog signals, may be used in communications systems such as wireless telecommunications and satellite communications, and may be semiconductor based or vacuum tube based.

The performance demanded of amplifiers continues to increase, and many conventional amplifiers are failing to keep pace. For example, conventional semiconductor microwave amplifiers lack the power capabilities required by many modern microwave systems. As a result, vacuum tube power amplifiers are essential components of many modern microwave systems, including telecommunications, radar, electronic warfare, and navigation systems, because microwave tube amplifiers can provide microwave energy at levels of power higher by orders of magnitude in comparison to semiconductor microwave amplifiers. The higher power levels offered by tube devices are facilitated by the fact that electrons can travel at a much higher velocity in a vacuum than in a semiconductor. The higher velocity permits use of larger structures with the same transit time. Larger structures, in turn, permit greater power levels.

The power amplification for modern high power vacuum electronic microwave amplifiers (VEMAs), however, is typically non-linear. For instance, phase non-linearity may be caused when the electrons slow down while moving through an interactive region of the tube. That slowing is a result of the electrons losing kinetic energy as they amplify a signal passing through the tube. At high power levels, however, the electrons start to slow down significantly and desynchronize from the RF field in the interactive region, thereby causing a phase lag between the input and output signals. For example, without phase compensation, the phase delay of the output signal for a traveling wave tube (TWT) VEMA operating at its saturation point may be as great as 70°–80°, which may be unacceptable for many applications, such as digital communications. Moreover, at high power levels, the beam current is not large enough to continue amplifying the input signal, causing an RF saturation or an amplitude non-linearity. Thus, non-linearity in power amplification generates higher-order intermodulation products, which may result in undesirable spectral regrowth in adjacent channels, and phase distortions, which in turn may increase bit errors in digital communications systems. The drawbacks are especially acute in digital wireless communications systems where multiple communication signals are typically multiplexed onto a single, narrow wavelength-band, channel due to the limited RF spectrum bandwidth. Accordingly, practical communication limitations as well as government standards require minimal higher-order intermodulation and phase distortion.

One technique to minimize power amplification non-linearity is to operate a VEMA only in its linear range, which typically is a small fraction of its power capacity. For example, for an application that requires 50 Watts of amplification power, a tube capable of 500 Watts of amplification power may be required to produce an adequate linear range. This technique, of course, is inefficient and expensive. Another known technique, commonly referred to as the feed forward technique, involves coupling the input signal to a low power linear amplifier in parallel to the main power amplifier to provide cancellation of the non-linear portions of the carrier signal at higher power levels. An additional method, referred to a the predistortion technique, involves distorting the characteristics of the input signal to the main power amplifier to cancel the non-linear characteristics of the amplifier. Both the feed forward technique and the predistortion technique, however, require the processing of the carrier signals, which for microwave applications is on the order of gigahertz. Consequently, both these techniques require very expensive circuitry which is difficult to tune.

Accordingly, there exists a need for an efficient and inexpensive technique for improving the linearity of high power vacuum electronic microwave amplifiers.

BRIEF SUMMARY OF INVENTION

The present invention is directed to an amplifier system. According to one embodiment, the amplifier system includes a vacuum tube amplifier having an input signal terminal, an output signal terminal, and an electron source, and a control circuit having an input terminal coupled to one of the input signal terminal and the output signal terminal, and for controlling a kinetic energy of electrons emitted by the electron source based on one of an input signal to the vacuum tube amplifier and an output signal from the vacuum tube amplifier.

According to another embodiment, the amplifier system includes a vacuum tube amplifier having an input signal terminal, an output signal terminal, and an electron source, and a control circuit for controlling an amount of electrons emitted by the electron source based on one of the input signal to the vacuum tube amplifier and the output signal from the vacuum tube amplifier.

According to another embodiment, the amplifier system includes a vacuum tube amplifier having an input signal terminal, an output signal terminal, and an electron source, and a control circuit may for controlling the kinetic energy of electrons emitted by the electron source based on one of an input signal to the vacuum tube amplifier and an output signal from the vacuum tube amplifier, and for controlling the amount of electrons emitted by the electron source based on one of the input signal and the output signal.

In contrast to prior techniques, the present invention provides an efficient and inexpensive technique for linearizing the power amplification of vacuum tube amplifiers. The present invention provides an advantage over the prior techniques because, according to one embodiment, it provides for the dynamic compensation of the deleterious effects caused by nonlinear power amplification of a vacuum tube amplifier based on the power, or envelope, of the input signal to the amplifier, thereby permitting the use of less expensive and more efficient components. These and other benefits of the present invention will be apparent from the detailed description of the invention hereinbelow.

DESCRIPTION OF THE FIGURES

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements of a conventional vacuum tube device. Those of ordinary skill in the art will recognize that those and other elements may be desirable. However, because such elements are well known in the art, and because they do not facilitate a better understanding of the present invention, a discussion of such elements is not provided herein.

Figure 1:
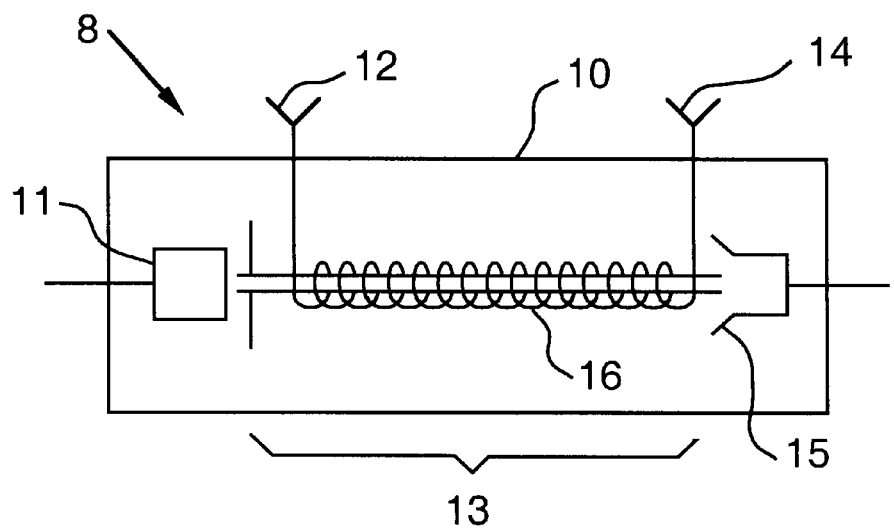
FIG. 1 is a schematic diagram of one type of vacuum tube device.

FIG. 1 is a schematic diagram of one type of a vacuum tube device 8 including an evacuated tube 10, a source of electrons 11, an input signal terminal 12 for introducing an input signal, an interaction region 13 where electrons interact with the input signal, and an output signal terminal 14 where an amplified signal emerges from the tube 8.

The vacuum tube device 8 may be, for example, a traveling wave tube (TWT), as illustrated in FIG. 1. A TWT typically includes a focusing magnet (not shown) to focus the beam of electrons through the interaction region 13, a collector 15 to collect the electron beam after the output microwave power has been generated, and an internal attenuator (not shown) to absorb microwave power reflected back into the tube from mismatches in the output. Although the present invention will be described in the context of a TWT, the benefits of the present invention may be realized with other vacuum tube devices such as, for example, klystrons and triodes.

The source of electrons 11 may be, for example, an electron gun. An electron gun is a particular kind of electron source which generates, accelerates, and focuses an electron beam so that the beam follows a desired trajectory after it leaves the electron gun. An electron gun is discussed in more detail hereinbelow with respect to FIG. 2.

The input signal terminal 12 receives an input signal, which is typically an amplitude modulated carrier signal. The carrier signal may be, for example, in the microwave frequency range. The carrier signal may be modulated by a data signal, such as a voice data signal having a frequency, for example, in the kHz range, or a video data signal having a frequency, for example, in the MHz range. Of course, the carrier signal may also be modulated by other types of data signals. In any event, the frequency of the data signal modulating the carrier signal may be significantly less than the frequency of the carrier signal.

The interactive region 13 is a portion of the tube 8 where the input signal is amplified through interaction with an electron beam. The interaction region 13 may include, for example, a conductive helix 16, as illustrated in FIG. 1, for broadband applications or a coupled-cavity region (not shown) for high power applications. In the case of a conductive helix 16, for example, the electron beam may pass through the helix 16 while the signal to be amplified is conducted on the helix 16, and inductive interactions occur between the signal and the electrons. The signal modulates the electron beam, and the modulated electron beam amplifies the signal. Typically, it is desirable for the signal to be amplified and the electrons to move along the interaction region at the same speed. If, however, there is a speed deviation between the signal and the electrons which is a function of the power of the signal, phase distortion and some amplitude distortion may occur.

The output signal terminal 14 is the pathway by which the signal leaves the tube device 8. The signal on the output signal terminal 14 is an amplified version of the input signal that entered the tube device 8 at the input signal terminal 12.

The present invention is directed to a technique to dynamically compensate for distortion caused by the non-linear characteristics of the tube device 8. As described hereinbelow, the present invention allows for the reduction of phase distortion and amplitude distortion caused by the tube device 8. In particular, according to one embodiment, the present invention is directed to a technique which controls, based on the power, or envelope, of the input signal or the output signal, the kinetic energy of electrons emitted by the electron source 11. According to another embodiment, the present invention is directed to a technique to control the number of electrons (or current) emitted by the electron source 11 in the tube device 8. According to another embodiment, the present invention is directed to a technique to control both the kinetic energy of electrons emitted by the electron source 11 and the number of electrons emitted by the electron source 11.

Figure 2:
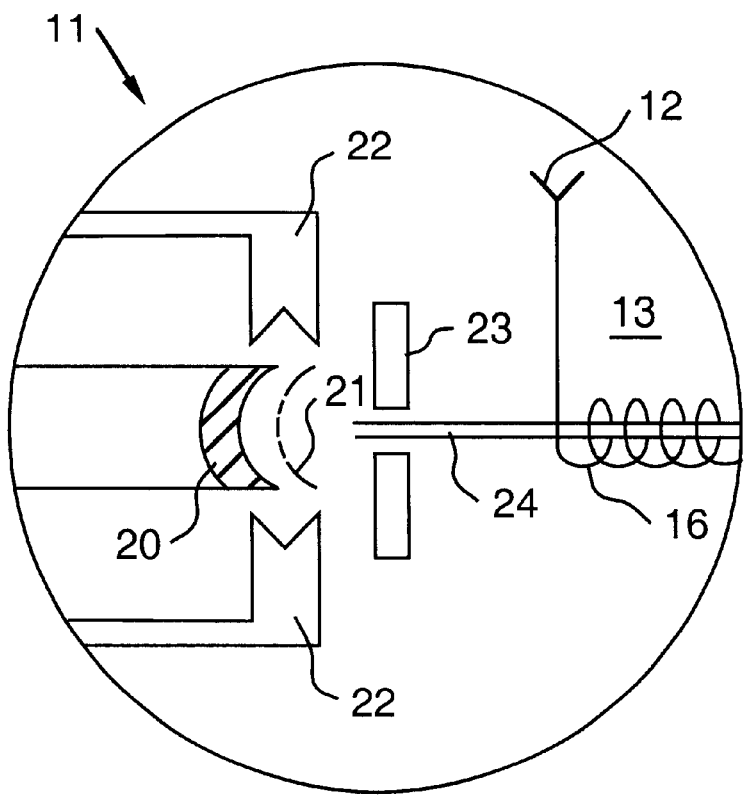
FIG. 2 is a schematic diagram of a source of electrons of the vacuum tube device of FIG. 1.

FIG. 2 is a schematic diagram of a source of electrons 11 in the form of an electron gun according to one embodiment of the present invention. In that embodiment, the source of electrons 11 includes a thermionic cathode 20, one or more grids 21 for inducing emission of electrons, focusing electrodes 22 for focusing the electrons into a beam, and an apertured anode 23 for further directing the electron beam 24 into the interaction region 13. The source of electrons 11 produces an electron beam 24. For TWT applications, a long, thin electron beam 24 at relatively low voltage and high current density is typically desirable. Electron guns have many embodiments and variations, such as a planar cathode faced by a planar anode to more elaborate designs such as Pierce guns, conical diode electrodes, concentric cylinders, and spherical cap cathodes. According to the present invention, the source of electrons 11 of the tube device 8 may be, for example, any such electron gun.

The cathode 20 introduces the electrons into the tube 10. The cathode 20 is typically at a lower voltage relative to the grid(s) 21, the anode 23, and the helix 16. This may be realized, for example, by applying a negative voltage to the cathode 20 such as, for example, −10 kV, and grounding the anode 23 and the helix 16. The voltage potential difference between the cathode 20 and the grid(s) 21 typically is on the order of 100 V.

The voltage potential difference between the cathode 20 and the anode 23 affects the kinetic energy of the electrons emitted by the cathode 20: the greater the voltage potential difference the greater the kinetic energy of the emitted electrons, and the lesser the voltage potential the lesser the kinetic energy of the electrons. The kinetic energy of the emitted electrons may also be increased by providing a voltage potential difference between the cathode 20 and the interaction region 13 of the tube device 8, such as by modulating the voltage potential difference between the cathode 20 and the helix 16 according to, for example, the serrodyning technique. The number of electrons emitted by the cathode 20, which is proportional to the current of the electron beam 24, is related to the voltage potential difference between the cathode 20 and, for example, the focusing electrodes 22 or the grid(s) 21.

Figure 3:
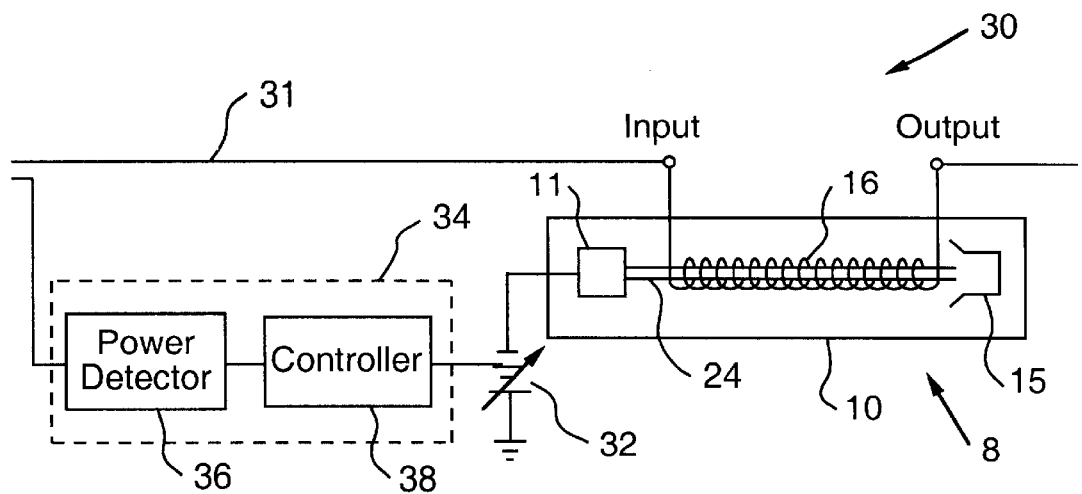
FIG. 3 is a combination schematic/block diagram of an amplifier system according to one embodiment of the present invention.

FIG. 3 is a combination schematic/block diagram of an amplifier system 30 according to one embodiment of the present invention. The system 30 includes a tube device 8, a variable power source 32 connected to the electron source 11, and a control circuit 34 connected to the variable power source 32 for linearizing certain of the power amplification characteristics of tube device 8.

The control circuit 34 in the illustrated embodiment compensates for phase distortion cause by the non-linear characteristics of the tube device 8 and includes a power detector 36 and a controller 38. The control circuit 34 is coupled to the input signal of the tube device 8, such as, for example, by directional coupling. The control circuit 34 modulates the relative voltages in the electron source 11, such as the voltage of the cathode 20 relative to the anode 23, based on the power level of the input signal. In that way, the control circuit 34 may adjust the kinetic energy, and hence the velocity, of the electrons emitted by the electron source 11, thereby reducing the amount of phase delay between the input signal and the output signal.

The power detector 36 is coupled to the input signal and determines the power level, or envelope, of the input signal. The power detector 36 may be, for example, a crystal power detector or any other type of power detector, such as an integrated circuit. In particular, the power detector 36 determines the power level of the carrier signal modulated by the data signal. As described hereinbefore, the frequency of the data signal is typically lower than the frequency of the carrier signal. The power detector 36 outputs a signal indicative of the detected power level. The signal may be, for example, an analog voltage signal or a digital signal.

The controller 38 receives the signal from the power detector 36 and generates a control signal that is provided to the variable voltage source 32 to compensate for variations in the power level of the input signal. The relationship between the output of the controller 38 and the power level of the input signal, as determined by the power detector 36, may not be linear because the phase distortion introduced by the tube device 8 is not linear with respect to the signal power.

The control signal output by the controller 38 may be a function of the non-linearity of the tube device 8 and the power detector 36, as well as the power level of the input signal. That is, the typically non-linear relationship between the output of the controller 38 and the power of the input signal, as determined by the power detector 36, may be function of the non-linear characteristics of the tube device 8 and the power detector 36. The relationship may be determined, for example, by iterative testing of a particular tube device 8. According to one embodiment, a low power RF signal may be applied to the tube device 8, and the phases of the input and output signals may be compared. For low power input signals, the phase difference may be considered a nullity. Progressively, the power of the input signal may be increased, and the phases of the input and output signals compared. At certain points in the progression, the voltage applied to the cathode 20 may be increased so that there is no phase difference between the input and output signals. Accordingly, a relationship between the power of the input signal and the cathode voltage needed to eliminate the phase lag may be determined. This relationship may be used to provide the appropriate control signal from the controller 38 to the cathode 20 to reduce phase distortion.

Figure 3A:
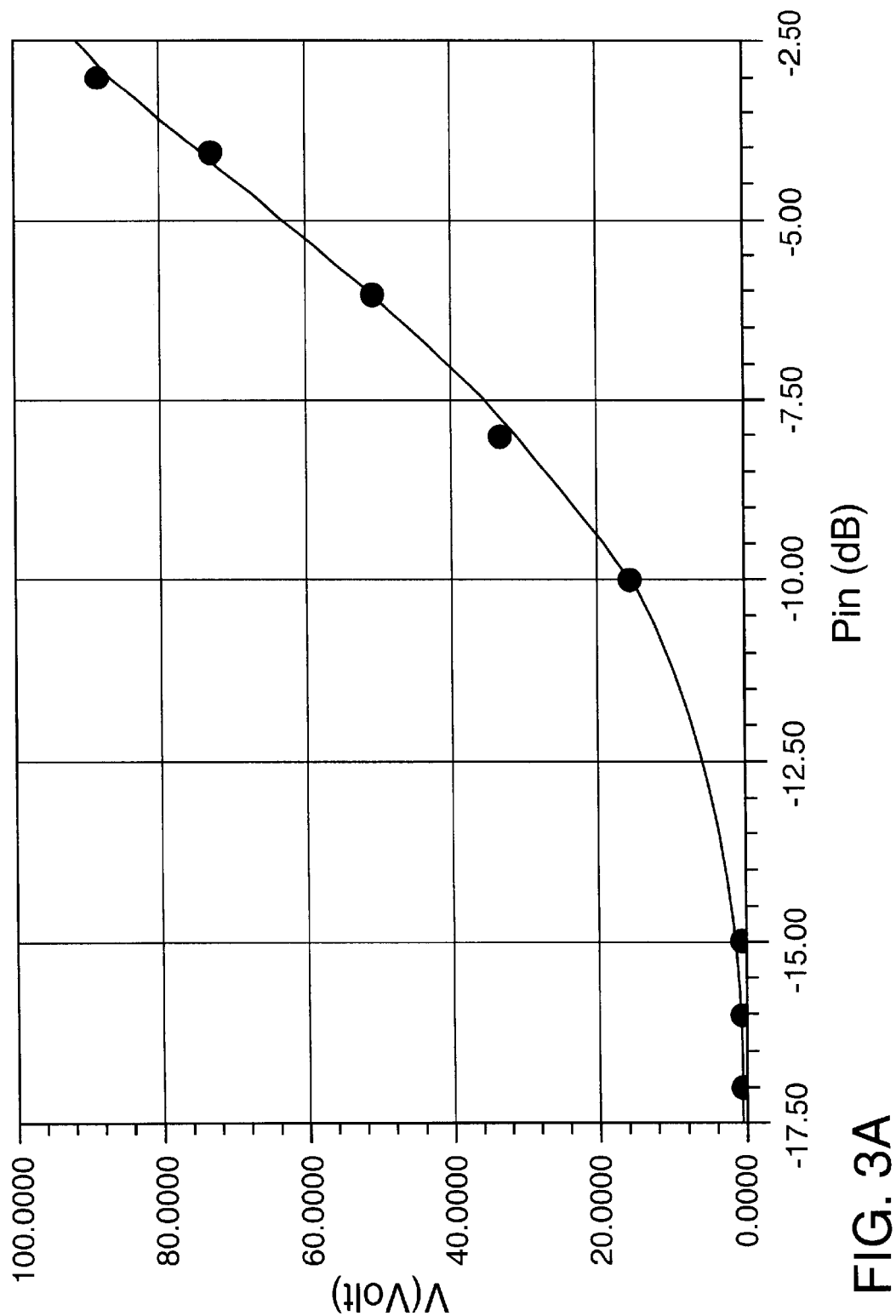
FIG. 3A is a graphical representation of an example of the relationship between the power of the input signal and the cathode correction voltage required to eliminate the phase lag between the input signal and the output signal for a Teledyne Technologies MEC5445 tube device.

FIG. 3A is a graphical representation of an example of the relationship between the power of the input signal ($P_{in}$) and the cathode correction voltage necessary to eliminate the phase lag between the input signal and the output signal. The graph of FIG. 3A is for a Teledyne Technologies MEC5445 tube device, available from Teledyne Technologies, Inc., Los Angeles, Calif. As can be seen, the relationship may be non-linear. Moreover, an equation representative of the relationship may be derived, such as:

$$V = ae^{-bP_{in}^2} \qquad (1)$$

where V is the cathode correction voltage in volts, $P_{in}$ is the input power in dBm, and a, b are coefficients, such as a=102.467 (volts), and b=0.0188 (dBm$^{-2}$) for the illustrated graphical representation.

The controller 38 may be either a digital device or an analog device, and the control signal output from the controller 38 may be an analog voltage signal or a digital signal. For an embodiment in which the controller 38 is a digital device, the controller 38 may be, for example, a digital signal processor (DSP) or an application specific integrated circuit (ASIC), programmed to map the output signal of the power detector 36 to the appropriate control signal to be supplied to the variable power source 32 such that the appropriate voltage is applied to the electron source 11 to minimize phase distortion. Conventional DSP technology, however, has an upper operating frequency that is inadequate for some applications. In such cases, an analog gain circuit may be implemented to control the gain of the controller. One example of such a gain circuit is described in more detail hereinbelow with respect to FIG. 4.

The variable power source 32 provides variable power to the electron source 11 based on the control signal provided by the controller 38, which is a function of the power level of the input signal.

A delay line 31 may be included between the input terminal 12 of the tube device 8 and the point where the input signal is coupled to the control circuit 34. The purpose of the delay line 31 is to delay the input signal to compensate for a time delay caused by the control circuit 34.

Figure 4:
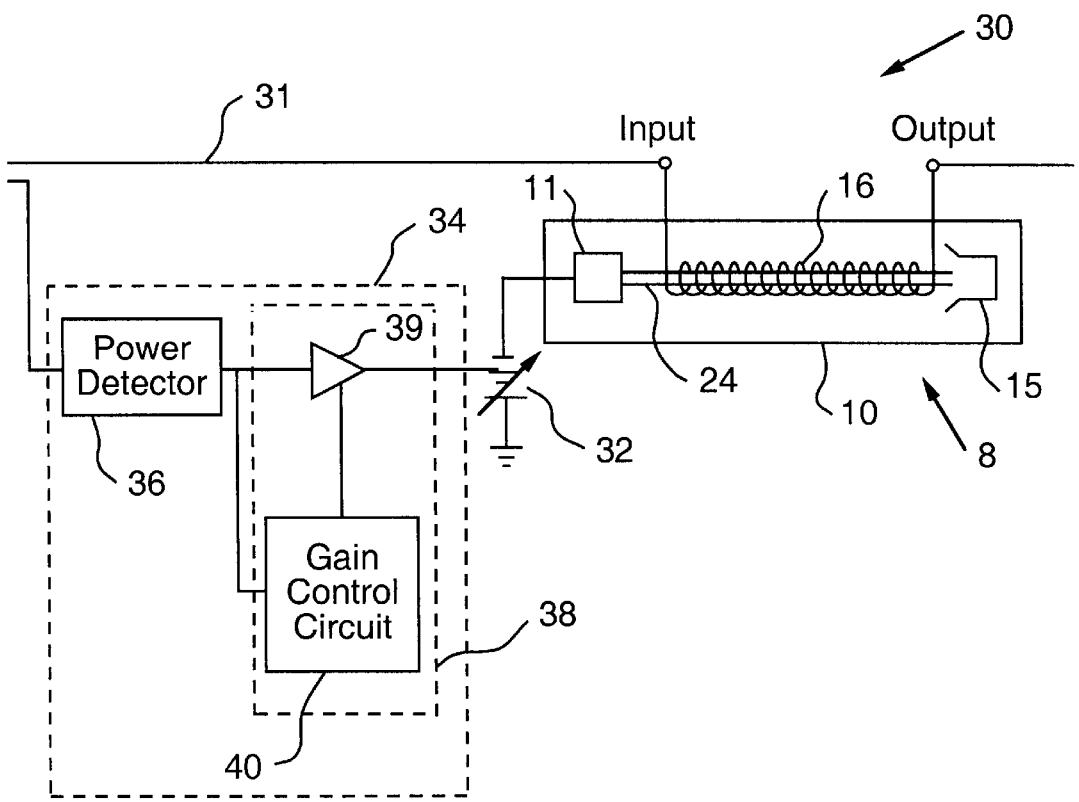
FIG. 4 is a combination schematic/block diagram of the amplifier system according to another embodiment of the present invention.

FIG. 4 is a combination schematic/block diagram of the amplifier system 30 according to one embodiment of the present invention in which the controller 38 is an analog device. According to such an embodiment, the controller 38 may include an analog amplifier 39 and a gain control circuit 40. The analog amplifier 39 may be, for example, a liner amplifier or a non-linear amplifier. The gain control circuit 40 may have an input terminal connected to the output terminal of the power detector 36 and an output terminal connected to a gain control terminal of the analog amplifier 39. The gain control circuit 40 may be, for example, a function generator and tuned to the power amplification characteristics of the tube device 8 and the non-linearity characteristics of the power detector 36. As such, the gain control circuit 40 may control the gain level of the analog amplifier 39 based on the characteristics of the power detector 36 and the tube device 8 such that the appropriate voltage signal is applied to the electron source 11 via the variable power source 32 to minimize phase delay caused by the non-linearity of the tube device 8.

Figure 5:
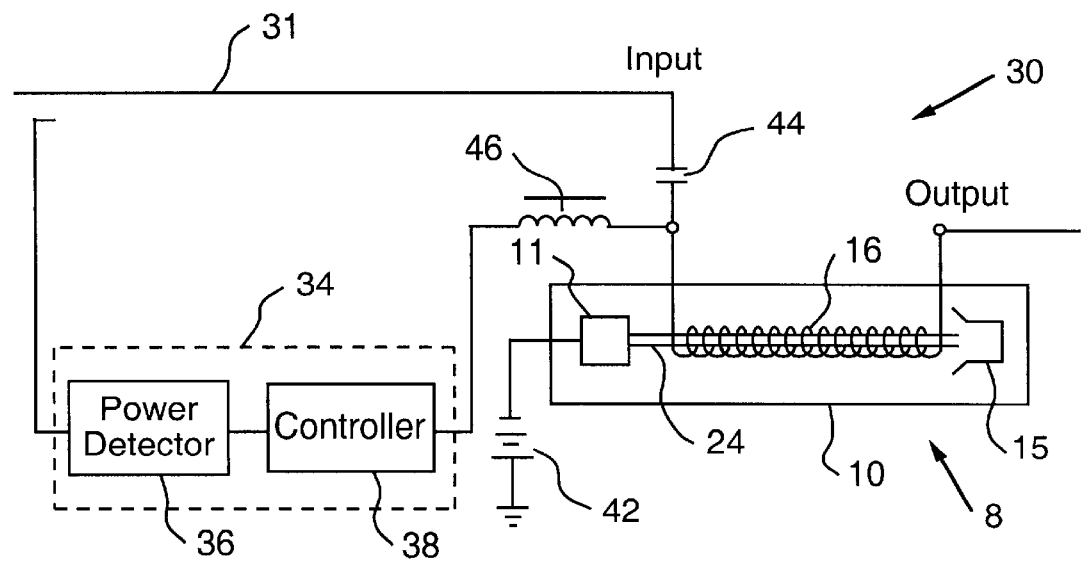
FIG. 5 is a combination schematic/block diagram of the amplifier system according to another embodiment of the present invention.

FIG. 5 is a combination schematic/block diagram of the amplifier system 30 according to another embodiment of the present invention. That embodiment includes a non-variable power source 42 connected to the electron source 11 of the tube device 8. In addition, the input signal is coupled to the helix 16 of the tube device 8 via a blocking capacitor 44, and the output signal of the controller 38 is coupled to the helix 16 via a choke 46 according to, for example, a serrodyne modulation technique.

According to the illustrated embodiment, the control signal output from the controller 38 may be a low frequency voltage signal, which is applied to the helix 16, such that the voltage signal applied to the helix 16 causes the electrons emitted by the electron source 11 to accelerate at an increased rate to compensate for the phase delay caused by the non-linearity of the tube device 8. Thus, the voltage of the helix 16 may modulated relative to the voltage of the cathode 20 according to the serrodyne modulation technique.

The capacitor 44 isolates the low frequency control signal output from the control circuit 34 from the high frequency input signal, and the choke 46 isolates the control circuit 34 from the high frequency input signal. In addition, the choke 46 may isolate the tube device 8 from spurious high frequency signals generated by the control circuit 34. Consequently, the amplifier system 30 illustrated in FIG. 5 operates to minimize the phase delay caused by the non-linearity of the tube device 8 in a fashion similar to the amplifier system 30 illustrated in FIG. 3, except that instead of applying an increased negative voltage to the cathode 20 relative to the anode 23 to enhance the acceleration of the electrons emitted by the electron source 11, an increased positive voltage is applied to the helix 16 relative to the cathode 20.

Figure 6:
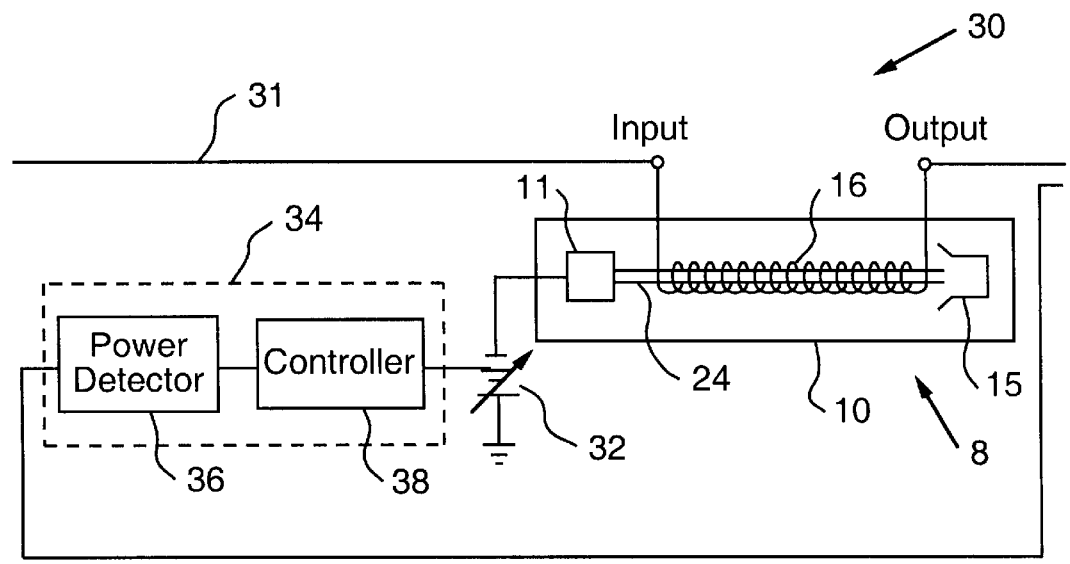
FIG. 6 is a combination schematic/block diagram of the amplifier system according to another embodiment of the present invention.

FIG. 6 is a combination schematic/block diagram of the amplifier system 30 according to another embodiment of the present invention. The amplifier system 30 illustrated in FIG. 6 is similar to that of FIG. 3, except that the input terminal of the power detector 36 is coupled to the output signal of the tube device 8 rather than the input signal. According such an embodiment, the power detector 36 may output a signal proportional to the envelope of the output signal. The controller 38 may then output the appropriate control signal based on the output signal from the power detector 36, and the control signal may be applied to the electron source 11 of the tube device 8 to compensate for the phase delay caused by the non-linearity of the tube device 8, as described hereinbefore with respect to FIG. 3.

Figure 7:
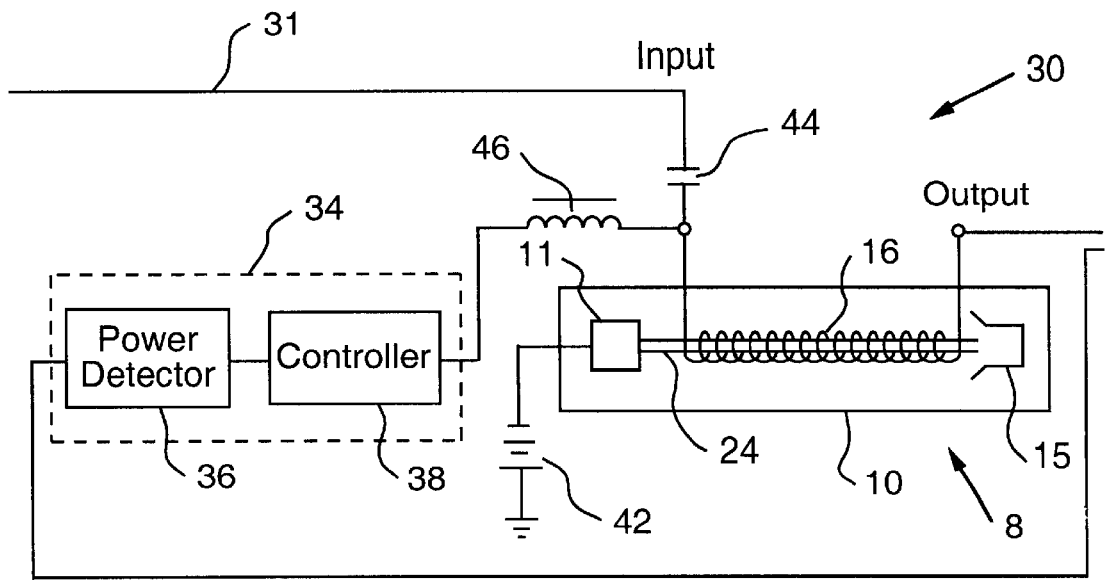
FIG. 7 is a combination schematic/block diagram of the amplifier system according to another embodiment of the present invention.

FIG. 7 is a combination schematic/block diagram of the amplifier system 30 according to another embodiment of the present invention in which the control circuit 34 is coupled to the output signal of the tube device 8. The amplifier system 30 illustrated in FIG. 7 is similar to that illustrated in FIG. 6, except that the output of the controller 38 is coupled to the helix 16 to increase the acceleration of the electron emitted from the electron source 11, as described hereinbefore with regard to FIG. 5.

Figure 8:
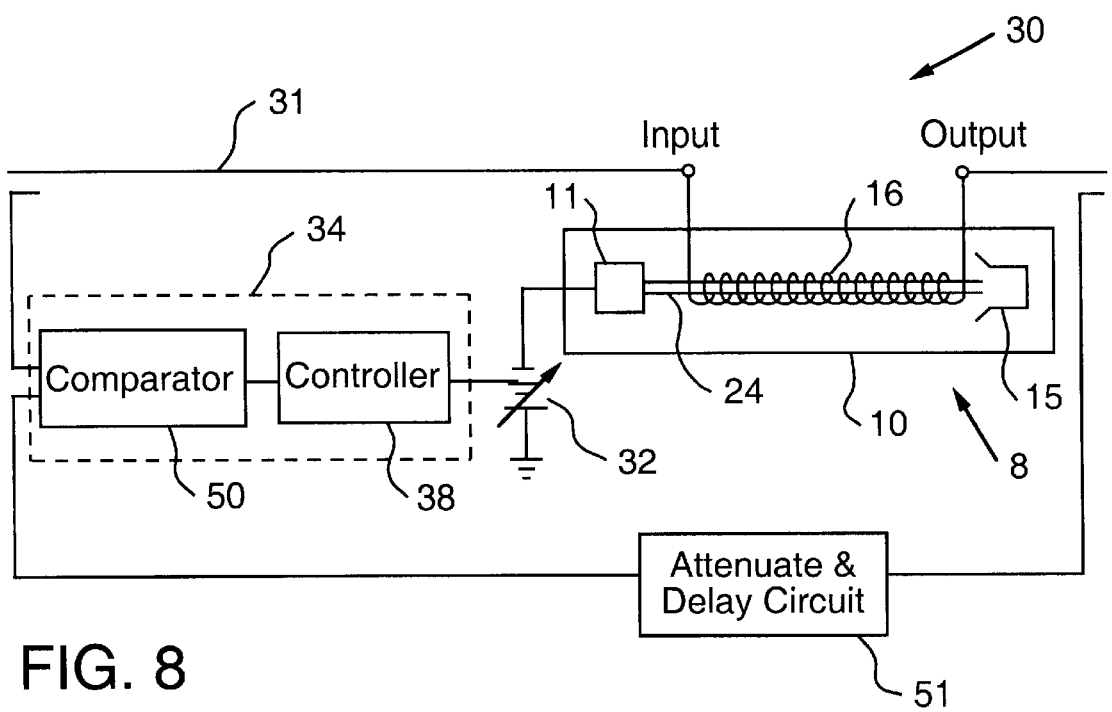
FIG. 8 is a combination schematic/block diagram of the amplifier system according to another embodiment of the present invention.

FIG. 8 is a combination schematic/block diagram of the amplifier system 30 according to another embodiment of the present invention in which a phase-lock loop is used to compensate for the phase delay caused by the non-linearity of the tube device 8. The control circuit 34 for the illustrated embodiment includes a comparator 50 having a first input terminal coupled to the input signal of the tube device 8 and a second input terminal coupled to the output signal of the tube device 8. An attenuate and delay circuit 51 may be coupled between the output signal and the comparator 50 to harmonize the power and time delay of the input and output signals to be compared by the comparator 50.

The comparator 50 may compare the phases of the input signal and the output signal, and output a signal to the controller 38 proportional to the phase difference. The controller 38 may generate the appropriate control signal based on the output signal from the comparator 50. The control signal is then applied to the electron source 11 of the tube device 8 via the variable power source 32, as described hereinbefore with regard to FIG. 3, to modulate the electron beam 24 emitted by the electron source 11 to compensate for the phase delay generated by the non-linearity of the tube device 8.

The comparator 50 may be, for example, a digital device or an analog device. For an embodiment in which the comparator 50 is an analog device, a power detector (not shown) may be coupled between the comparator 50 and the controller 38 to cancel the carrier frequency of the input and output signals.

Figure 9:
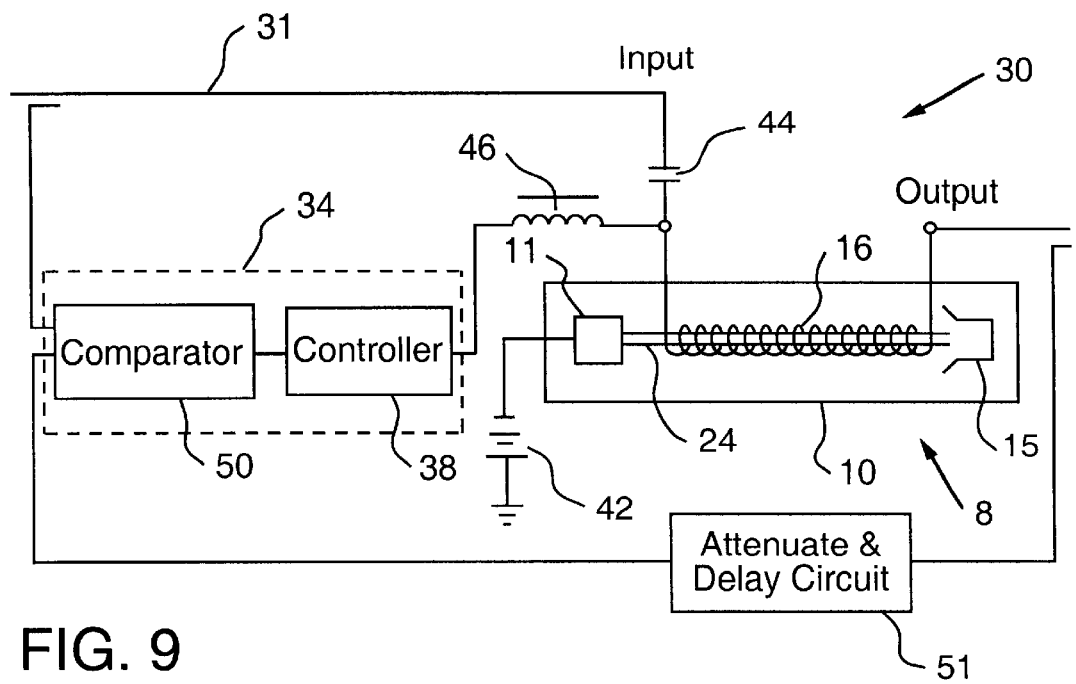
FIG. 9 is a combination schematic/block diagram of the amplifier system according to another embodiment of the present invention.

FIG. 9 is a combination schematic/block diagram of the amplifier system 30 according to another embodiment of the present invention. The amplifier system 30 illustrated in FIG. 9 is similar to that illustrated in FIG. 8, except that the output of the controller 38 is coupled to the helix 16 of the tube device 8. According to such an embodiment, the control signal output by the controller 38 may be a voltage signal supplied to the helix 16 to accelerate electrons from the electron source 11, as described hereinbefore with respect to FIG. 5.

Figure 10:
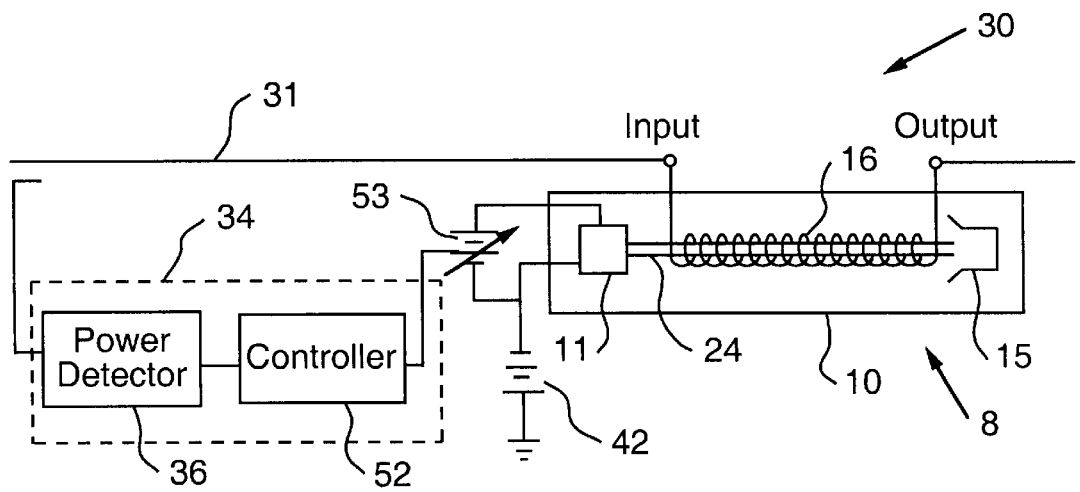
FIG. 10 is a combination schematic/block diagram of the amplifier system according to another embodiment of the present invention.

FIG. 10 is a combination schematic/block diagram of the amplifier system 30 according to another embodiment of the present invention. The control circuit 34 in the illustrated embodiment includes an controller 52 having an input terminal coupled to the output terminal of the power detector 36 and an output terminal coupled to the electron source 11 of the tube device 8 via a variable power source 53. The control circuit 34 according to such an embodiment may be utilized, for example, to control the amplitude distortion of the input signal as it is amplified by the non-linear tube device 8. The amplitude distortion of the input signal by the tube device 8 is related to the current of the electron beam 24 generated by the electron source 11. The current of the electron beam 24 may be increased by increasing the number of electrons emitted from the electron source 11. According to one embodiment, the current of the electron beam 24 may be increased by, for example, increasing a voltage applied to the focusing electrodes 22 of the electron source 11 relative to the cathode 20. Alternatively, the current of the electron beam 24 may be increased by increasing the voltage applied to the grid(s) 21 relative to the cathode 20. The variable power source 53 provides variable power to either the focusing electrodes 22 or the grid(s) 21 of the electron source 11 based on the control signal provided by the controller 52, which is a function of the power level of the input signal.

As described hereinbefore, the power detector 36 may output a signal representative of the power of the amplitude modulated input signal. Based on the input from the power detector 36, the controller 52 may output the appropriate control signal to the electron source 11 to affect the current of the electron beam 24 generated by the electron source 11. According to one embodiment, the controller 52 may be coupled to the focusing electrodes 22 of the electron source 11 to modulate the voltage of the focusing electrodes 22 relative to cathode 20 to control the current of the electron beam 24 to compensate for the amplitude distortion caused by the non-linearity of the tube device 8. According to another embodiment, the output of the controller 52 may be coupled to the grid(s) 21. For such an embodiment, the control signal from the controller 52 may be a voltage signal which is applied to the grid(s) 21 to generated a voltage potential difference between the grid(s) 21 and the cathode 20 to dynamically compensate for the non-linear characteristics of the tube device 8. The voltage of the signal applied to the grid(s) 21 may depend upon the distance between the grid(s) 21 and the cathode 20, and may be on the order of, for example, 10 V.

For an embodiment in which the control signal is a voltage signal, the gain level of the controller 52 may depend upon the voltage of the output signal from the power detector 36 and the voltage required by either, for example, the focusing electrodes 22 or the grid(s) 21, to appropriately adjust the current of the electron beam 24 based on the characteristics of the tube device 8. For example, if the signal output from the power detector 36 needs to be attenuated to apply the appropriate voltage to either the focusing electrodes 22 or the grid(s) 21, the controller 52 may have a negative gain (in terms of dB). Conversely, if the signal output from the power detector 36 needs to be amplified to apply the appropriate voltage to either the focusing electrodes 22 or the grid(s) 21, the controller 52 may have a positive gain. The controller 52 may be tuned to the non-linear characteristics of the tube device 8 and the power detector 36 and may be, for example, a digital device or an analog device, as described hereinbefore.

Figure 11:
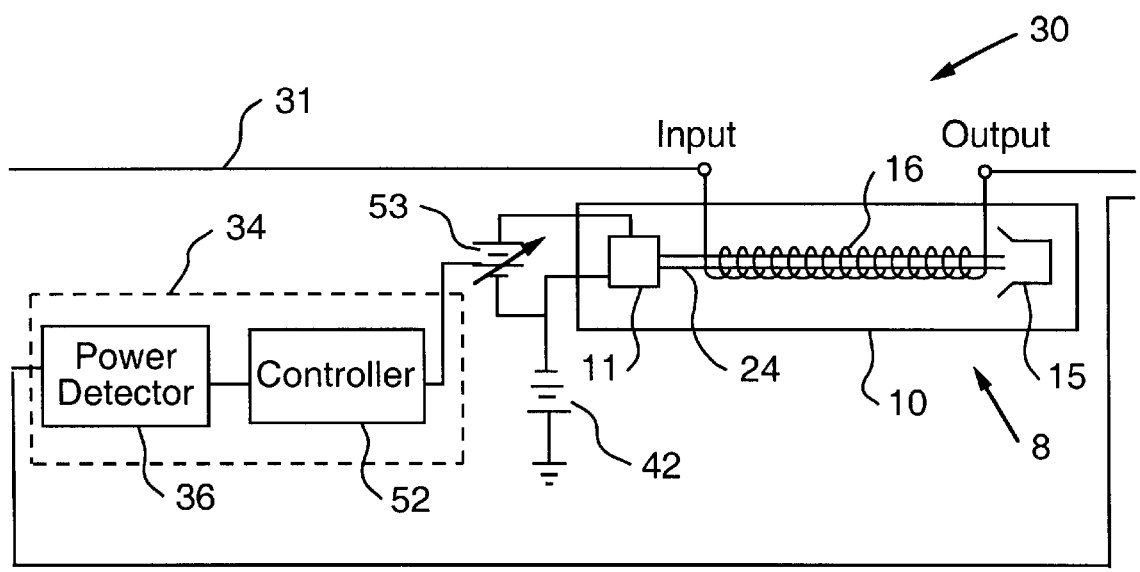
FIG. 11 is a combination schematic/block diagram of the amplifier system according to another embodiment of the present invention.

FIG. 11 is a combination schematic/block diagram of the amplifier system 30 according to another embodiment of the present invention. The amplifier system 30 illustrated in FIG. 11 is similar to that of FIG. 10, except that the power detector 36 is coupled to the output signal rather than the input signal.

Figure 12:
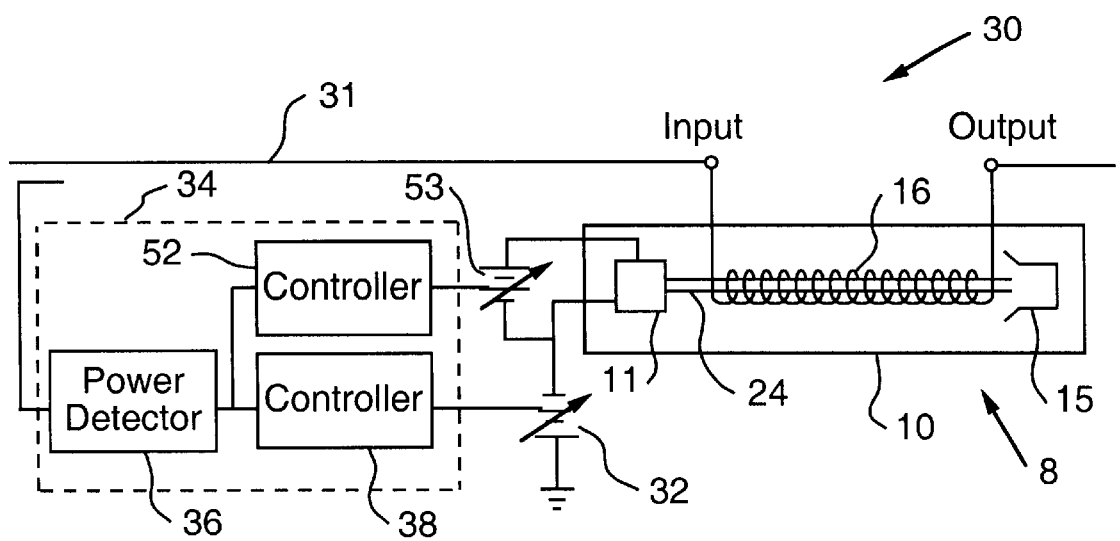
FIG. 12 is a combination schematic/block diagram of the amplifier system according to another embodiment of the present invention.

FIG. 12 is a combination schematic/block diagram of the amplifier system 30 according to another embodiment of the present invention. The control circuit 34 of the illustrated embodiment includes the power detector 36 and both the controller 38 and the controller 52. As described hereinbefore, the power detector 36 may output a signal indicative of the power of the input signal. The controller 38 may generate the appropriate control signal to be applied to the cathode 20 of the electron source 11 via the variable power source 32 to modulate the voltage applied to the cathode 20 relative to the anode 23 based on the signal from the power detector 36, to control the kinetic energy of electrons emitted by the electron source 11, as described hereinbefore with respect to FIG. 3. In addition, controller 52 may generated the appropriate control signal to be applied to, for example, the focusing electrodes 22 or the grid(s) 21 of the electron source 11, to modulate the current of the electron beam 24 generated by the electron source 11 to compensate for the amplitude distortion caused by the non-linearity of the tube device 8 based on the output signal from the power detector 36, as described hereinbefore with respect to FIG. 10. Thus, the control circuit 34 of the illustrated embodiment may be used to compensate for both the phase distortion and the amplitude distortion caused by the non-linearity of the tube device 8. According to another embodiment, the input terminal of the power detector 36 may be coupled to the output signal, as described hereinbefore with respect to FIGS. 6 and 11.

Figure 13:
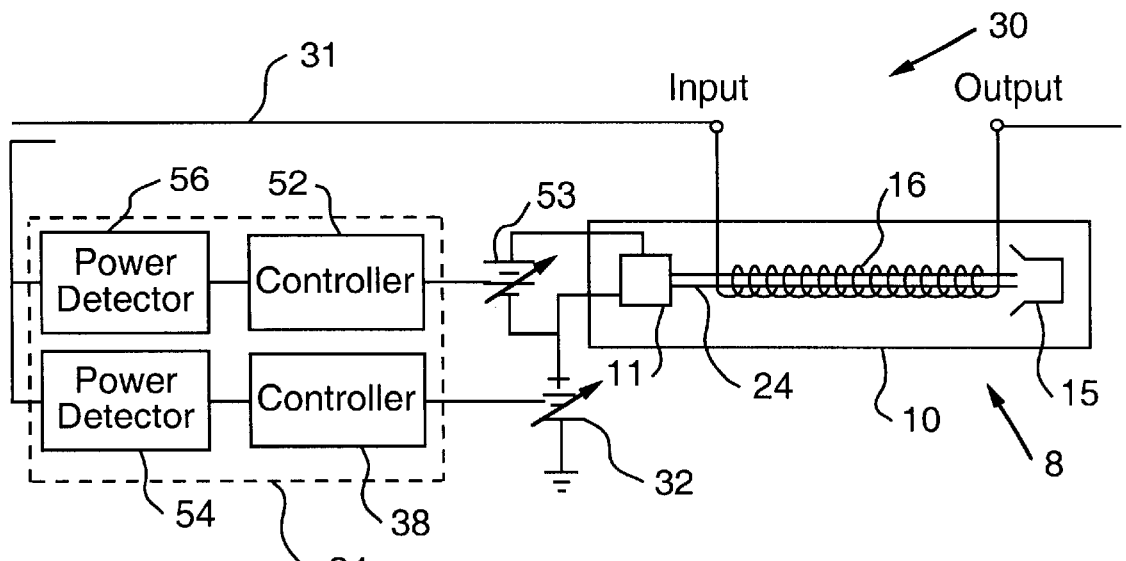
FIG. 13 is a combination schematic/block diagram of the amplifier system according to another embodiment of the present invention.

FIG. 13 is a combination schematic/block diagram of the amplifier system 30 according to another embodiment of the present invention. The amplifier system 30 illustrated in FIG. 13 is similar to that of FIG. 12, except that the control circuit 34 includes two power detectors 54, 56. Each of the power detectors 54, 56 may be coupled to the input signal, and each may be coupled to one of the controllers 38, 52 to provide phase and amplitude compensation as described hereinbefore with respect to FIG. 12. According to another embodiment, one or both of the power detectors 54, 56 may be coupled to the output signal, as described hereinbefore with respect to FIGS. 6 and 11.

Figure 14:
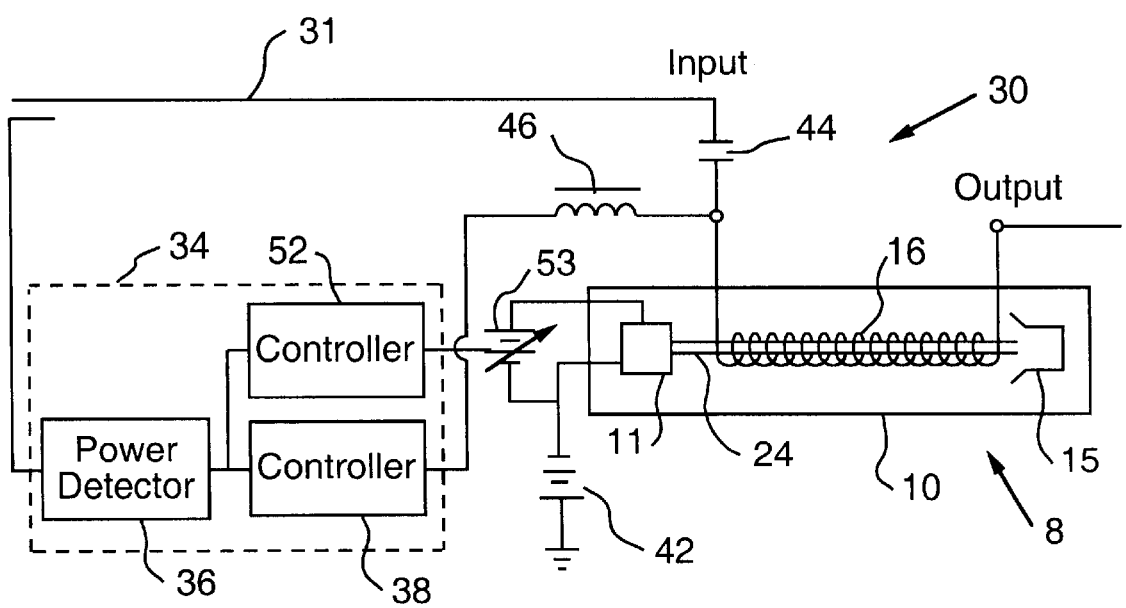
FIG. 14 is a combination schematic/block diagram of the amplifier system according to another embodiment of the present invention.

FIG. 14 is a combination schematic/block diagram of the amplifier system 30 according to another embodiment of the present invention. The amplifier system 30 illustrated in FIG. 14 is similar to that of FIG. 12, except that the control signal from the controller 38 is coupled to the helix 16 to modulate the voltage of the helix 16 relative to the cathode 20 to control the kinetic energy of electrons emitted by the electron source 11, and thereby compensate for phase distortion caused by the non-linearity of the tube device 8, as described hereinbefore with respect to FIG. 5. According to another embodiment, the input terminal of the power detector 36 may be coupled to the output signal of the tube device 8. According to yet another embodiment, the control circuit 34 may include two power detectors rather than one, as described hereinbefore with respect to FIG. 13, wherein each of the power detectors may be coupled to one of the controllers 38, 52. For such an embodiment, one or both of the power detectors may be coupled to the output signal rather than the input signal.

Figure 15:
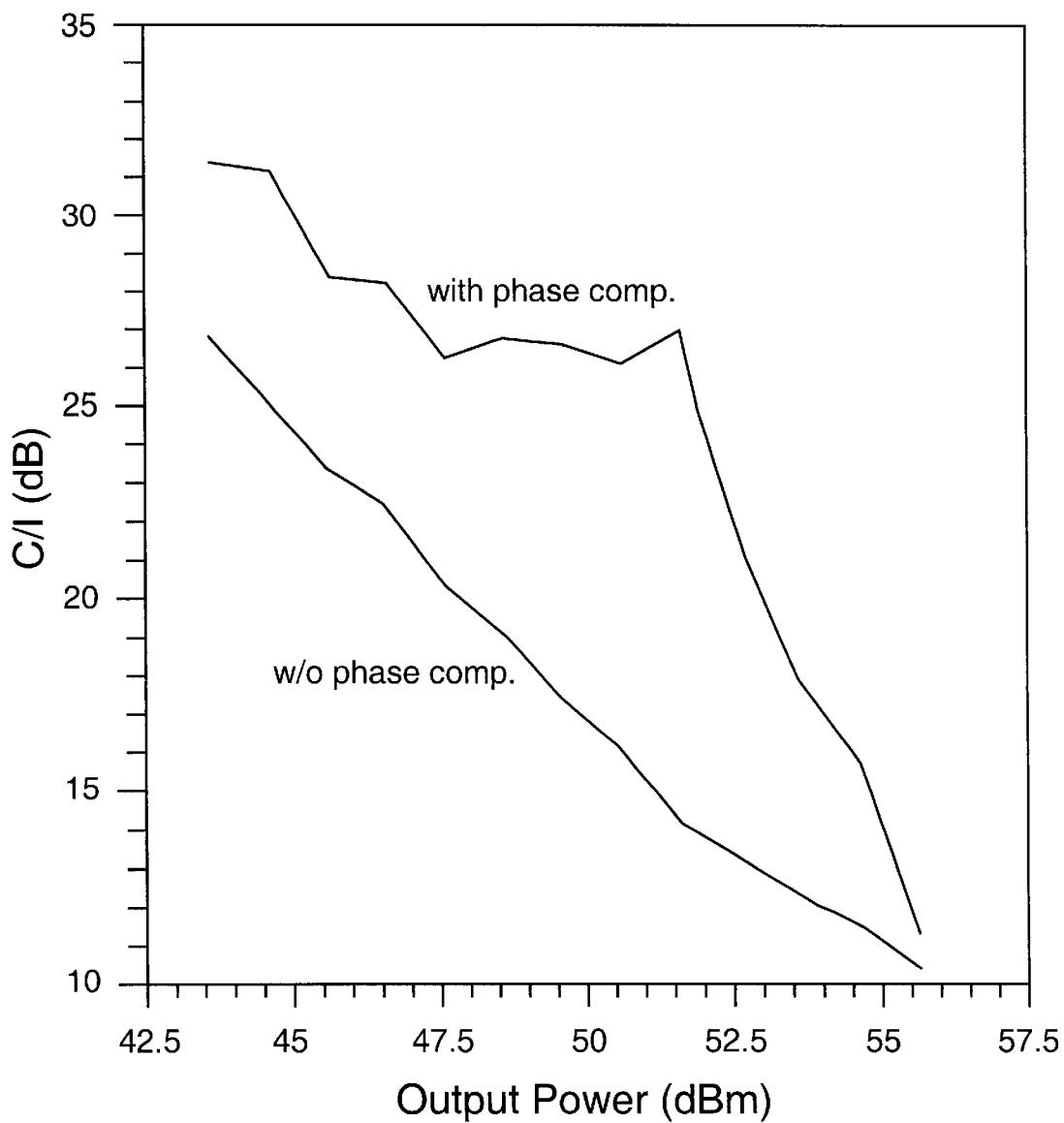
FIG. 15 is a graph illustrating the ratio of carrier signal power to intermodulation power versus output power for a Teledyne Technologies MEC5445 vacuum tube amplifier.

The superior phase compensation characteristics of the amplifier system 30 of the present invention are depicted graphically in FIG. 15. FIG. 15 is a graph depicting the ratio of carrier power (C) to intermodulation power (I) versus output power for a Teledyne Technologies MEC5445 tube device, available from Teledyne Technologies, Inc., Los Angeles, Calif., for an input signal having a frequency of 14 GHz without phase compensation and with the phase compensation amplifier system 30 shown in FIG. 3 hereinbefore. Generally, it is beneficial to maximize the ratio C/I because this represents that most of the power of the output signal is at the carrier frequency rather than higher order intermodulations.

As can be seen, the ratio of C/I is generally several dB higher for the phase compensation amplifier system 30 of the present invention than without phase compensation over the range of output power. For example, at an output power of 51.5 dBm, the C/I ratio with the phase compensation technique of the present invention is approximately 26.5 dB, but only 14.5 dB without phase compensation. Thus, the difference is approximately 12 dB or about 20 times better.

The implication of such superior phase compensation is that, for example, for a TWT without phase compensation, to achieve a 300 W power amplification, the TWT must have a power capacity of approximately 3 kW. In contrast, with the phase compensation amplification circuit 30 of the present invention, the same 300 W power amplification may be achieved with a TWT having a power capacity of approximately 400 W. Accordingly, the present invention provides for less expensive and more efficient vacuum tube amplifier systems.

The present invention is also directed to a method for reducing the phase distortion between the input and output signals of the tube device 8, including detecting the power of either the input signal or the output signal, and adjusting the kinetic energy of the electrons emitted from the electron source 11 of the tube device 8 based on the detected power. According to another embodiment, the present invention is directed to a method for reducing amplitude distortion between the input signal and the output signal of the tube device 8, including detecting the power of either the input signal or the output signal, and adjusting the amount of electrons emitted from the electron source 11 based on the detected power.

The present invention is also directed to a method for controlling the kinetic energy of electrons emitted from the electron source 11 of the vacuum tube device, and includes detecting the power, or envelope, of either the input or output signals, and modulating the electron beam 24 of the electron source 11 based on the detected power. According to one embodiment, the electron beam 24 is modulated by modulating the voltage supplied to the cathode 20. According to another embodiment, the electron beam 24 is modulated by modulating the voltage of the helix 16, such as according to the serrodyne modulation technique.

The present invention is also directed to a method for controlling the amount of electrons emitted from the electron source 11 of the tube device 8, and includes detecting the power of either the input signal or the output signal of the tube device 8, and modulating the voltage of either the focusing electrodes 22 or the grid 21 of the electron source 11, based on the detected power.

Although the present invention has been described with regard to certain embodiments thereof, those of ordinary skill in the art will recognize that many modifications and variations of the present invention may be implemented. For example, the phase and/or amplification distortion control circuits described hereinbefore may be embodied in a single device, such as one DSP or ASIC having an input terminal coupled to the input signal and outputting one or two control signals. According to such an embodiment, the DSP or ASIC may perform the functions of the both the power detector 36 and either or both of the controllers 38, 52. The foregoing description and the following claims are intended to cover all such modifications and variations.

What is claimed is:

1. A method comprising:
   detecting a power level of one of an input signal and an output signal of a vacuum tube device;
   modulating an electron beam emitted by an electron source of the vacuum tube device based on the detected power level; and
   modulating a voltage applied to one of a focusing electrode of the electron source and a grid of the electron source based on the detected power level.

2. The method of claim 1, wherein detecting the power level of one of the input signal and the output signal of the vacuum tube device includes detecting the power level of the input signal with a crystal power detector.

3. The method of claim 1, wherein detecting the power level of one of the input signal and the output signal of the vacuum tube device includes detecting the power level of the output signal with a crystal power detector.

4. The method of claim 1, wherein detecting the power level of one of the input signal and the output signal of the vacuum tube device includes comparing the power level of the input signal and the power level of the output signal.

5. The method of claim 4, wherein comparing the power level of the input signal and the power level of the output signal includes attenuating the power level of the output signal prior to comparing with the power level of the input signal.

6. A method for controlling the kinetic energy of electrons emitted from an electron source of a vacuum tube device, comprising:
   detecting a power level of one of an input signal and an output signal of the vacuum tube device; and
   modulating an electron beam emitted by the electron source by modulating a voltage applied to a helix of the vacuum tube device relative to a cathode of the electron source based on the detected power level.

7. The method of claim 6, wherein detecting the power level of one of the input signal and the output signal of the vacuum tube device includes detecting the power level of the input signal with a crystal power detector.

8. The method of claim 6, wherein detecting the power level of one of the input signal and the output signal of the vacuum rube device includes detecting the power level of the output signal with a crystal power detector.

9. The method of claim 6, wherein detecting the power level of one of the input signal and the output signal of the vacuum tube device includes comparing the power level of the input signal and the power level of the output signal.

10. The method of claim 9, wherein comparing the power level of the input signal and the power level of the output signal includes attenuating the power level of the output signal prior to comparing with the power level of the input signal.

11. A method for controlling the kinetic energy of electrons emitted from an electron source of a vacuum tube device, comprising:

detecting a power level of an input signal of the vacuum tube device with a crystal power detector; and modulating an electron beam omitted by the electron source based on the detected power level.

12. The method of claim 11, wherein modulating the electron beam emitted by the electron source includes modulating a voltage applied to a cathode of the electron source based on the detected power level.

13. The method of claim 11, wherein modulating the electron beam emitted by the electron source includes modulating a voltage applied to a helix of the vacuum tube device relative to a cathode of the electron source based on the detected power level.

14. The method of claim 11, wherein modulating the electron beam emitted by the electron source includes serrodyne modulating the vacuum tube device.

15. A method for controlling the kinetic energy of electrons emitted from an electron source of a vacuum tube device, comprising:

detecting a power level of an output signal of the vacuum tube device with a crystal power detector; and modulating an electron beam emitted by the electron source based on the detected power level.

16. The method of claim 15, wherein modulating the electron beam emitted by the electron source includes modulating a voltage applied to a cathode of the electron source based on the detected power level.

17. The method of claim 15, wherein modulating the electron beam emitted by the electron source includes modulating a voltage applied to a helix of the vacuum tube device relative to a cathode of the electron source based on the detected power level.

18. The method of claim 15, wherein modulating the electron beam emitted by the electron source includes serrodyne modulating the vacuum tube device.

19. A method for controlling the kinetic energy of electrons emitted from an electron source of a vacuum tube device, comprising:

comparing a power level of an input signal and a power level of an output signal of the vacuum rube device to determine a power level difference; and modulating an electron beam emitted by the electron source based on the power level difference.

20. The method of claim 19, wherein modulating the electron beam emitted by the electron source includes modulating a voltage applied to a cathode of the electron source based on the detected power level.

21. The method of claim 19, wherein modulating the electron beam emitted by electron source includes modulating a voltage applied to a helix of the vacuum tube device relative to a cathode of the electron source based on the detected power level.

22. The method of claim 19, wherein modulating the electron beam emitted by electron source includes serrodyne modulating the vacuum tube device.

23. The method of claim 19, further comprising attenuating the power level of output signal prior to comparing with the power level of the input signal.

24. A method for controlling an amount of electrons emitted from an electron source of a vacuum tube device, comprising:

detecting a power level of an output signal of the vacuum tube device with a crystal power detector; and modulating a voltage applied to one of a focusing electrode of the electron source and a grid of the electron source based on the detected power level.

25. A method for controlling an amount of electrons emitted from an electron source of a vacuum tube device, comprising:

comparing a power level of an input signal and a power of an output signal of the vacuum tube device to determine a power level difference; and modulating a voltage applied to one of a focusing electrode of the electron source and a grid of the electron source based on the detected power level difference.

* * * * *